(12) United States Patent
Lee et al.

(10) Patent No.: US 9,768,363 B2
(45) Date of Patent: Sep. 19, 2017

(54) LIGHT EMITTING DEVICE MODULE

(71) Applicant: LG INNOTEK CO., LTD., Seoul (KR)

(72) Inventors: Dong Yong Lee, Seoul (KR); Yong Jae Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/726,944

(22) Filed: Jun. 1, 2015

(65) Prior Publication Data

US 2015/0349219 A1 Dec. 3, 2015

(30) Foreign Application Priority Data

Jun. 2, 2014 (KR) .................... 10-2014-0066694

(51) Int. Cl.
| | |
|---|---|
| *H01L 33/50* | (2010.01) |
| *H01L 33/48* | (2010.01) |
| *H01L 33/54* | (2010.01) |
| *H01L 33/56* | (2010.01) |
| *H01L 33/58* | (2010.01) |

(52) U.S. Cl.
CPC .......... *H01L 33/505* (2013.01); *H01L 33/486* (2013.01); *H01L 33/54* (2013.01); *H01L 33/56* (2013.01); *H01L 33/58* (2013.01); *H01L 2224/14* (2013.01); *H01L 2224/16225* (2013.01); *H01L 2224/48091* (2013.01); *H01L 2224/48227* (2013.01); *H01L 2224/49107* (2013.01); *H01L 2924/181* (2013.01); *H01L 2933/0041* (2013.01); *H01L 2933/0058* (2013.01)

(58) Field of Classification Search
None
See application file for complete search history.

(56) References Cited

U.S. PATENT DOCUMENTS

| | | | |
|---|---|---|---|
| 7,352,011 B2 | 4/2008 | Smits et al. | |
| 2008/0035947 A1* | 2/2008 | Weaver Jr. et al. | 257/99 |
| 2010/0109025 A1* | 5/2010 | Bhat | H01L 24/97 257/88 |
| 2010/0176407 A1* | 7/2010 | Lee | H01L 33/483 257/98 |

(Continued)

FOREIGN PATENT DOCUMENTS

| | | |
|---|---|---|
| CN | 203351658 U | 12/2013 |
| DE | 10 2011 080 458 | 2/2013 |

(Continued)

OTHER PUBLICATIONS

European Examination Report dated Jul. 5, 2016.
European Search Report dated Feb. 10, 2017 issued in Application No. 15 170 349.3.

*Primary Examiner* — Johannes P Mondt
(74) *Attorney, Agent, or Firm* — KED & Associates, LLP

(57) ABSTRACT

Embodiments provide a light emitting device module including a circuit board, a light emitting device bonded to a conductive layer on the circuit board via a conductive adhesive, a phosphor layer disposed on a side surface and an upper surface of the light emitting device, and a lens on the circuit board and the phosphor layer. A void is generated between the light emitting device and the circuit board.

16 Claims, 8 Drawing Sheets

(56) References Cited

U.S. PATENT DOCUMENTS

| | | | | |
|---|---|---|---|---|
| 2011/0198643 A1* | 8/2011 | Kim | ............................... | 257/98 |
| 2012/0267647 A1* | 10/2012 | Kim et al. | ..................... | 257/88 |
| 2014/0103378 A1* | 4/2014 | Lin | ........................ | H01L 33/60 |
| | | | | 257/98 |
| 2014/0217436 A1* | 8/2014 | Hussell | .................. | H01L 33/62 |
| | | | | 257/98 |

FOREIGN PATENT DOCUMENTS

| | | | | |
|---|---|---|---|---|
| EP | 2 711 615 A1 | | 3/2014 | |
| JP | 2007-208136 A | * | 8/2007 | ............ H01L 33/00 |
| JP | 2013012516 A | | 1/2013 | |
| JP | 2013-138132 | | 7/2013 | |
| KR | 10-2009-0040770 | | 4/2009 | |
| KR | 20120032899 A | | 4/2012 | |
| KR | 10-2012-0078878 A | | 7/2012 | |

* cited by examiner

LIGHT EMITTING DEVICE MODULE

CROSS REFERENCE TO RELATED APPLICATION

This application claims priority under 35 U.S.C. §119 to Korean Patent Application No. 10-2014-0066694 filed in Korea on Jun. 2, 2014, whose entire disclosure is incorporated herein by reference.

BACKGROUND

1. Field

Embodiments relate to a light emitting device module.

2. Background

Group III-V compound semiconductors such as, for example, GaN and AlGaN are widely used for optoelectronics and electronics because of many advantages such as, for example, easily controllable wide band gap energy.

In particular, light emitting devices, such as light emitting diodes or laser diodes, which use group III-V or II-VI compound semiconductors, are capable of emitting visible and ultraviolet light of various colors such as red, green, and blue owing to development of device materials and thin film growth techniques. These light emitting devices are also capable of emitting white light with high luminous efficacy through use of phosphors or color combination and have several advantages of low power consumption, semi-permanent lifespan, fast response speed, safety, and environmental friendliness as compared to conventional light sources such as, for example, fluorescent lamps and incandescent lamps.

Accordingly, application sectors of the light emitting devices are expanded up to transmission modules of optical communication means, light emitting diode backlights to replace Cold Cathode Fluorescence Lamps (CCFLs) which serve as backlights of Liquid Crystal Display (LCD) apparatuses, white light emitting diode lighting apparatus to replace fluorescent lamps or incandescent lamps, vehicular headlamps, and traffic lights.

In a light emitting device, a light emitting structure, which includes a first conductive semiconductor layer, an active layer, and a second conductive semiconductor layer, is disposed on a substrate formed of, for example, sapphire and a first electrode and a second electrode are respectively disposed on the first conductive semiconductor layer and the second conductive semiconductor layer. The light emitting device emits light having energy determined by an intrinsic energy-band of a material constituting the active layer in which electrons introduced through the first conductive semiconductor layer and holes introduced through the second conductive semiconductor layer meet each other. Light emitted from the active layer may vary based on the composition of the material constituting the active layer, and may be blue light, ultraviolet (UV) or deep UV light, for example.

The light emitting device as described above may be mounted in a package form to, for example, a backlight unit or a lighting apparatus.

FIG. 1 is a view illustrating a conventional light emitting device module.

In the light emitting device module 100, a light emitting device 10 is disposed on the bottom of a cavity of a package body 110 and a molding part 160 including phosphors 162 is charged around the light emitting device 10. The molding part 160 may serve as a lens.

A first lead frame 121 and a second lead frame 122 may be arranged in the package body 110. The light emitting device 10 may be electrically connected to the first lead frame 121 and the second lead frame 122 via wires 140 and 145 respectively.

A reflective layer R may be formed on the surface of the package body 110 and serve to reflect light emitted from the light emitting device 10 upward.

The package body 110 may be connected to a circuit board 180 such as, for example, a Printed Circuit Board (PCB) to receive current required for driving of the light emitting device 10.

However, the conventional light emitting device module as described above has the following problems.

The wires and the lead frames are required to supply current to the light emitting device and these materials may cause a cost increase. Moreover, the wires may hinder the progress of light emitted from the light emitting device, deteriorating light extraction efficiency.

In addition, the reflective layer R as described above may be formed of a high reflectivity metal, thus being discolored. For example, polypthalamide (PPA) constituting the package body may be easily discolored by heat.

BRIEF DESCRIPTION OF THE DRAWINGS

The embodiments will be described in detail with reference to the following drawings in which like reference numerals refer to like elements wherein.

DESCRIPTION OF SPECIFIC EMBODIMENTS

Hereinafter, exemplary embodiments to concretely realize the above objects will be described in detail with reference to the accompanying drawings.

In the following description of the embodiments, it will be understood that, when each element is referred to as being formed "on" or "under" the other element, it can be directly "on" or "under" the other element or be indirectly formed with one or more intervening elements therebetween. In addition, it will also be understood that "on" or "under" the element may mean an upward direction and a downward direction of the element.

Figure 1:
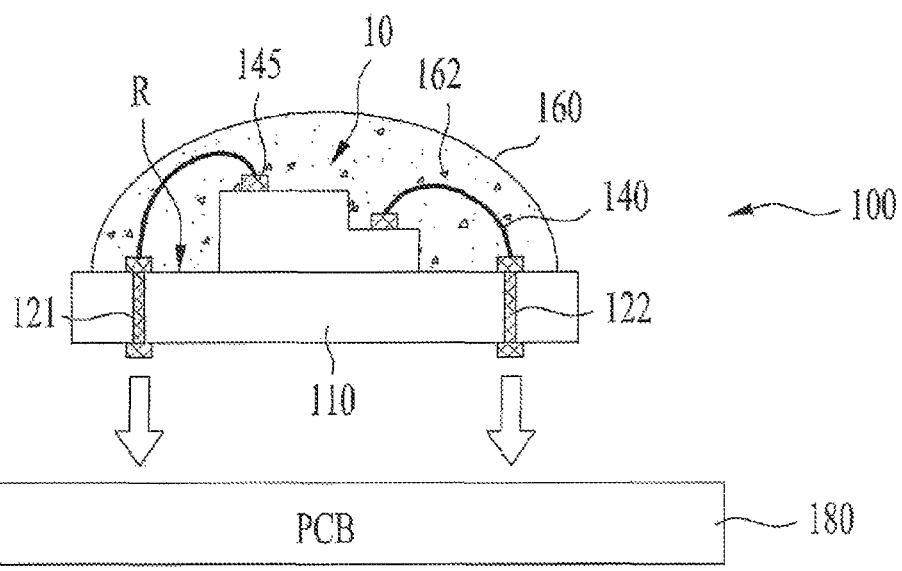
FIG. 1 is a view illustrating a conventional light emitting device module.
Figure 2:
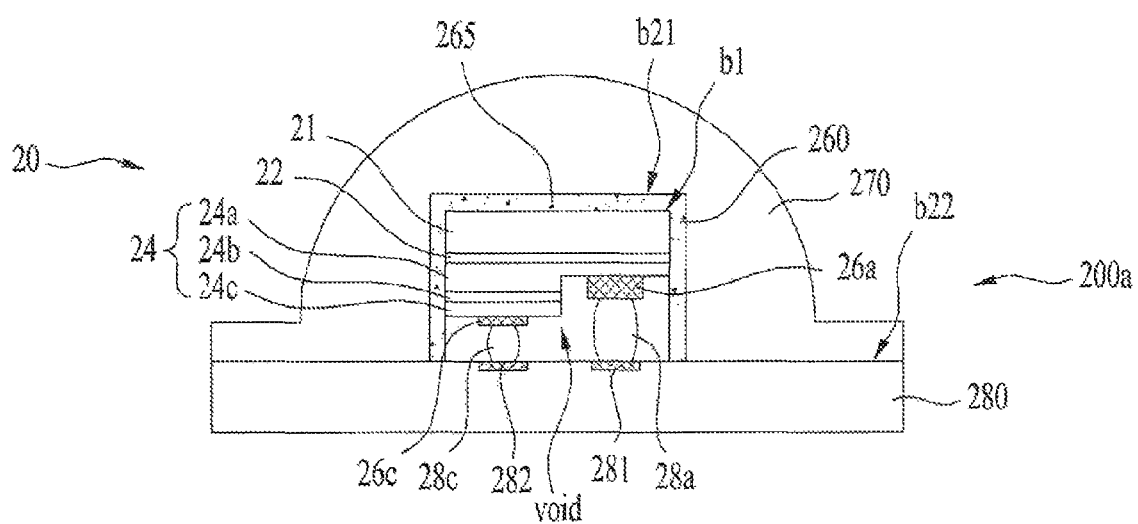
FIG. 2 is a view illustrating a first embodiment of a light emitting device module.

FIG. 2 is a view illustrating a first embodiment of a light emitting device module.

The light emitting device module according to the present embodiment, designated by reference numeral 200a, includes a circuit board 280, a light emitting device 20 electrically connected to first and second conductive layers 281 and 282 on the circuit board 280, a phosphor layer 260 surrounding the light emitting device 20, and a lens 270 disposed over the phosphor layer 260 and the circuit board 280.

The circuit board 280 may be, for example, a Printed Circuit Board (PCB), a metal PCB, or an FR-4 board. The first conductive layer 281 and the second conductive layer 282 on the circuit board 280 may be electrically connected to a first electrode 26a and a second electrode 26c of the light emitting device 20 respectively.

The light emitting device 20 may be a flip chip type light emitting device as illustrated. A buffer layer 22 and a light emitting structure 24 are sequentially disposed on a substrate 21. The light emitting structure 24 includes a first conductive semiconductor layer 24a, an active layer 24b, and a second conductive layer 24c. The first electrode 26a and the second electrode 26c may be disposed respectively on the first conductive semiconductor layer 24a and the second conductive semiconductor layer 24c.

The substrate 21 may be formed of a material suitable for semiconductor material growth, or a carrier wafer. The substrate 21 may be formed of a highly thermally conductive material and include a conductive substrate or an insulation substrate. For example, the substrate 21 may utilize at least one selected from among sapphire ($Al_2O_3$), $SiO_2$, SiC, Si, GaAs, GaN, ZnO, GaP, InP, Ge, and $Ga_2O_3$.

When the substrate 21 is formed of, for example, sapphire and the light emitting structure 24 comprising, for example, GaN or AlGaN is disposed on the substrate 21, for example, dislocation, melt-back, cracking, pitting, and surface morphology defects that deteriorate crystallization may occur due to great lattice mismatch between GaN or AlGaN and sapphire and a great difference between thermal expansion coefficients thereof. Therefore, the buffer layer 22 may be formed of AlN, for example.

The first conductive semiconductor layer 24a may be formed of a compound semiconductor such as, for example, a group III-V or II-VI compound semiconductor and may be doped with a first conductive dopant. The first conductive semiconductor layer 24a may be formed of a semiconductor material having a composition of $Al_xIn_yGa_{(1-x-y)}N$ ($0 \leq x \leq 1$, $0 \leq y \leq 1$, $0 \leq x+y \leq 1$). For example, the first conductive semiconductor layer 24a may be formed of any one or more materials selected from among AlGaN, GaN, InAlGaN, AlGaAs, GaP, GaAs, GaAsP, and AlGaInP.

When the first conductive semiconductor layer 24a is an n-type semiconductor layer, the first conductive dopant may include an n-type dopant such as Si, Ge, Sn, Se, and Te. The first conductive semiconductor layer 24a may have a single layer or multi-layer form, without being limited thereto.

The active layer 24b is disposed on the upper surface of the first conductive semiconductor layer 24a and may include any one of a single-well structure, a multi-well structure, a single-quantum well structure, a multi-quantum well structure, a quantum dot structure and a quantum wire structure.

The active layer 24b is formed of a group III-V compound semiconductor and includes a well layer and a barrier layer having a pair structure of any one or more of AlGaN/AlGaN, InGaN/GaN, InGaN/InGaN, AlGaN/GaN, InAlGaN/GaN, GaAs(InGaAs)/AlGaAs, and GaP(InGaP)/AlGaP, without being limited thereto. The well layer may be formed of a material having a smaller energy band gap than an energy band gap of the barrier layer.

The second conductive semiconductor layer 24c may be formed of a compound semiconductor on the surface of the active layer 24b. The second conductive semiconductor layer 24c may be formed of a compound semiconductor such as a group III-V or II-VI compound semiconductor and may be doped with a second conductive dopant. The second conductive semiconductor layer 24c may be formed of, for example, a semiconductor material having a composition of $In_xAl_yGa_{1-x-y}N$ ($0 \leq x \leq 1$, $0 \leq y \leq 1$, $0 \leq x+y \leq 1$). For example, the second conductive semiconductor layer 24c may be formed of any one or more material selected from among AlGaN, GaN AlInN, AlGaAs, GaP, GaAs, GaAsP, and AlGaInP.

The second conductive semiconductor layer 24c may be doped with the second conductive dopant. When the second conductive semiconductor layer 24c is a p-type semiconductor layer, the second conductive dopant may be a p-type dopant such as Mg, Zn, Ca, Sr, and Ba. The second conductive semiconductor layer 24c may have a single layer or multi-layer form, without being limited thereto.

Although not illustrated, a light transmission conductive layer formed of, for example, an Indium Tin Oxide (ITO) may be formed on the second conductive semiconductor layer 24c, which may improve current spreading effects from the second electrode 26c to the second conductive semiconductor layer 24c.

Portions of the second conductive semiconductor layer 24c, the active layer 24b and the first conductive semiconductor layer 24a are removed via mesa etching to expose the first conductive semiconductor layer 24a for acquisition of an area where the first electrode 26a will be formed.

The first electrode 26a and the second electrode 26c are disposed respectively on the first conductive semiconductor layer 24a and the second conductive semiconductor layer 24c. The first electrode 26a and the second electrode 26c may be formed of at least one selected from among aluminum (Al), titanium (Ti), chrome (Cr), nickel (Ni), copper (Cu), and gold (Au) and have a single-layer or multi-layer form.

Although not illustrated, a passivation layer may be formed around the light emitting structure 24. The passivation layer may be formed of an insulation material. Specifically, the passivation layer may be formed of an oxide or nitride. More specifically, the passivation layer may be formed of a silicon oxide ($SiO_2$) layer, an oxide nitride layer, or an oxide aluminum layer.

The first electrode 26a and the second electrode 26c of the light emitting device 20 may be electrically connected to the first conductive layer 281 and the second conductive layer 282 of the circuit board 280 respectively via a conductive adhesive. In the present embodiment, solders 28a and 28c may be used for bonding.

The phosphor layer 260 is disposed around the light emitting device 20. The phosphor layer 260 is disposed on the upper surface and the side surface of the light emitting device 20.

In the present embodiment, the phosphor layer 260 extends from the side surface of the light emitting device 20 to the surface of the circuit board 280 so as to come into contact with the surface of the circuit board 280.

The phosphor layer 260 may comprise phosphors and a basic material comprising a silicon based polymer material such as, for example, a resin or rubber. As first wavelength light emitted from the light emitting device 20 excites the phosphors, second wavelength light may be emitted from the phosphors.

Voids may be generated between the light emitting device 20 and the circuit board 280 in a region inside the phosphor layer 260. The voids may be filled with air.

In the present embodiment, the phosphor layer 260 surrounds the light emitting device 20 while coming into contact with the circuit board 280. Therefore, the voids may be generated in a region surrounded by the phosphor layer 260 on the side surface of the light emitting device 20 and the underlying circuit board 280. At this time, the voids may come into contact with the light emitting structure 24 of the light emitting device 20.

In FIG. 2, the phosphor layer 260 comes into contact with the light emitting device 20, more particularly, the upper surface of the substrate 21 at an area designated by "b1". The lens 270 comes into contact with the phosphor layer 260 at an area designated by "b21" and also comes into contact with the circuit board 280 at an area designated by "b22".

The lens 270 may comprise the same material as the above-described phosphor layer 260. Specifically, the lens 270 may comprise a silicon based polymer material such as, for example, a resin or rubber. As exemplarily illustrated, the lens 270 may have a convex portion at a central region thereof corresponding to the light emitting device 20.

Figure 3A:
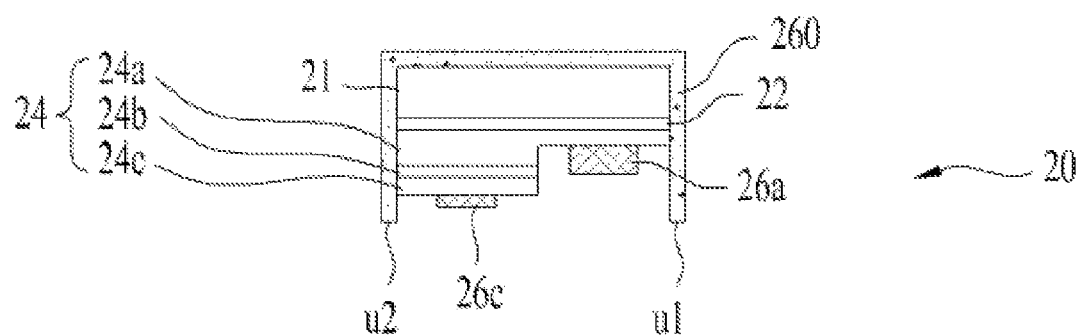
FIGS. 3A to 3C are views illustrating a process of manufacturing the light emitting device module of FIG. 2.
Figure 3B:
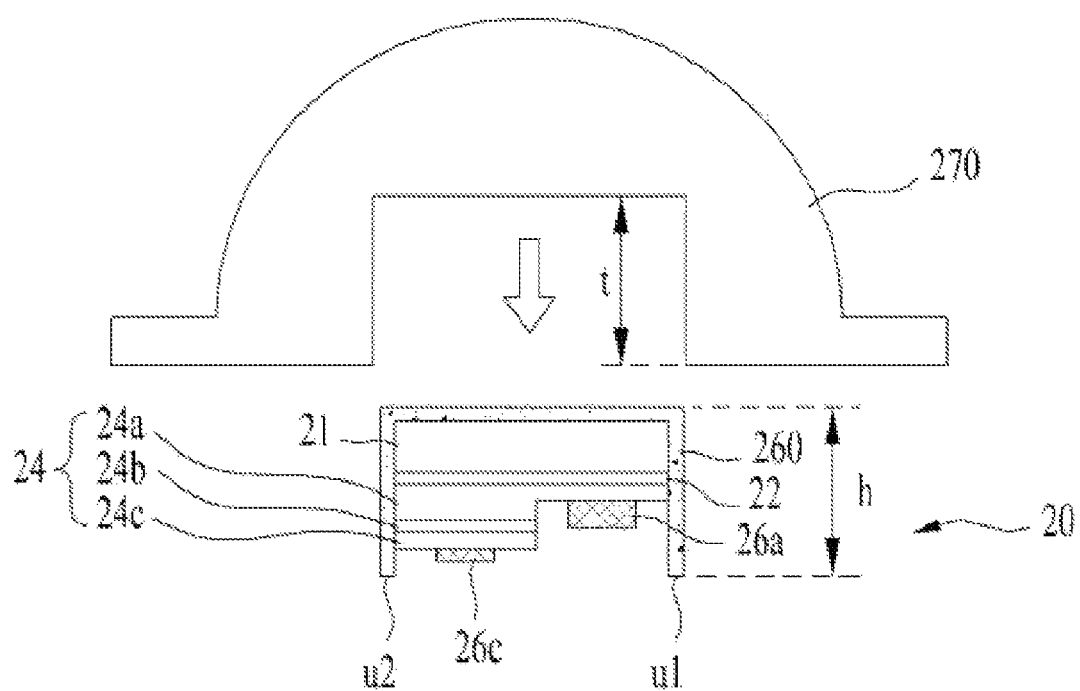
Figure 3C:
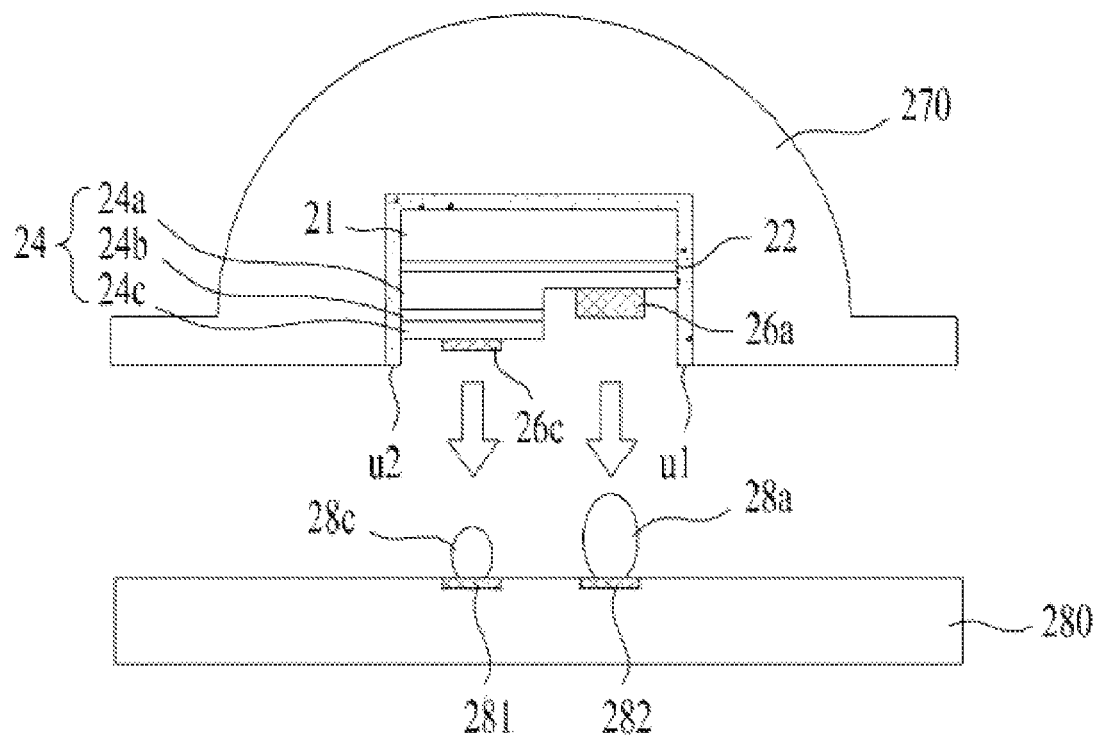

FIGS. 3A to 3C are views illustrating a process of manufacturing the light emitting device module of FIG. 2.

As exemplarily illustrated in FIG. 3A, the phosphor layer 260 is disposed around the flip chip type light emitting device 20. The phosphor layer 260 may be disposed in a conformal coating or film form. As illustrated, the upper surfaces u2 and u1 of the phosphor layer 260 may be respectively located higher than the first and second conductive semiconductor layers 24a and 24c or the first and second electrodes 26a and 26c.

Then, as exemplarily illustrated in FIG. 3B, the phosphor layer 260 disposed around the light emitting device 20 is inserted into a recess formed in the lens 270. At this time, a depth t of the recess formed in the lens 270 is equal to a height h of the phosphor layer 260. At this time, the lens 270 and the phosphor layer 260 may be attached to each other using the silicon based polymer material serving as a basic material as described above without requiring an adhesive.

Then, as exemplarily illustrated in FIG. 3C, the light emitting device 20 inserted in the recess of the lens 270 is coupled to the circuit board 280.

At this time, the solders 28a and 28c, which serve as a conductive adhesive, are arranged on the first conductive layer 281 and the second conductive layer 282 on the circuit board 280. The first electrode 26a and the second electrode 26c of the light emitting device 20 may be respectively fixed to the first conductive layer 281 and the second conductive layer 282 via the solders 28a and 28c.

Figure 4:
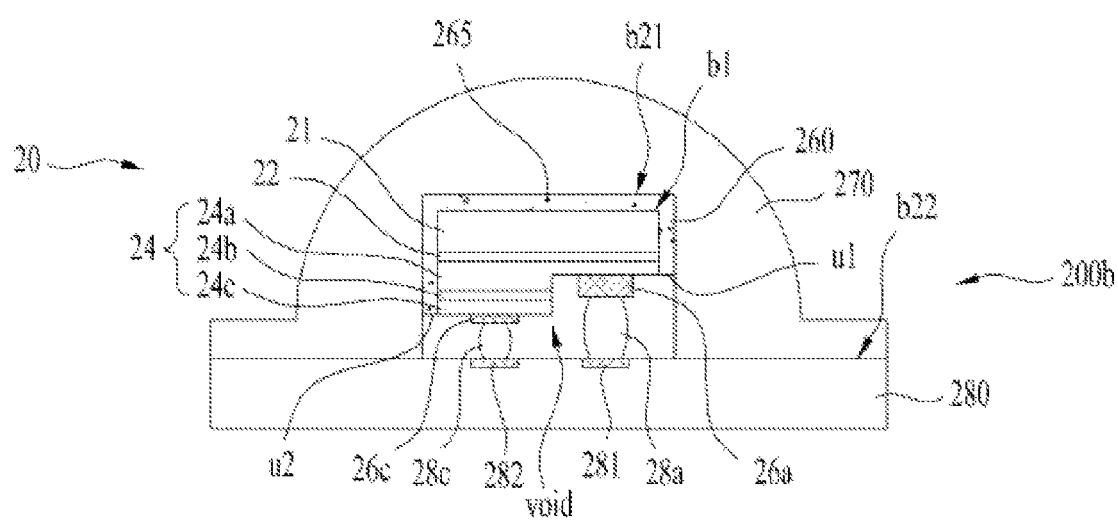
FIG. 4 is a view illustrating a second embodiment of a light emitting device module.

FIG. 4 is a view illustrating a second embodiment of a light emitting device module.

Although the light emitting device module 200b of the present embodiment is substantially equal to that of the above-described first embodiment, there is a difference in that the phosphor layer 260 does not come into contact with the circuit board 280.

That is, each of the upper surfaces u1 and u2 of the phosphor layer 260 has the same height as the first conductive semiconductor layer 24a or the second conductive semiconductor layer 24c adjacent thereto, such that voids may laterally come into contact with the lens 270.

Figure 5:
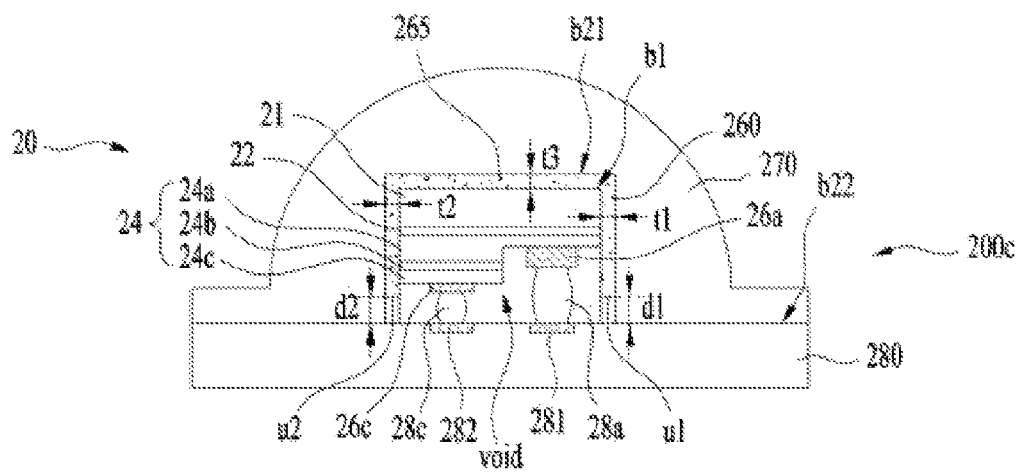
FIG. 5 is a view illustrating a third embodiment of a light emitting device module.

FIG. 5 is a view illustrating a third embodiment of a light emitting device module.

The light emitting device module 200c according to the present embodiment is substantially equal to those of the first embodiment and the second embodiment as described above except that, while the heights of the upper surfaces u1 and u2 of the phosphor layer 260 are higher than those of the first conductive semiconductor layer 24a and the second conductive semiconductor layer 24c, the phosphor layer 260 may do not come into contact with the circuit board 280 and voids may laterally come into contact with the phosphor layer 260 and the lens 270.

In FIG. 5, distances d1 and d2 between the upper surfaces u1 and u2 of the phosphor layer 260 and the circuit board 280 may be equal to each other at both sides of the light emitting device 20. In addition, thicknesses t1 and t2 of the phosphor layer 260 at both sides of the light emitting device 20 may be equal to a thickness t3 of the phosphor layer 260 at the upper surface of the light emitting device 20.

In the light emitting device modules according to the embodiments, wires and lead frames are omitted and the flip chip type light emitting device is directly coupled to the circuit board, which may result in reduced material costs and enhanced luminous efficacy owing to reduction in light absorption or shielding caused by wires. In addition, omission of a package body and a reflective layer on the package body may prevent distortion of color temperatures due to discoloration of the package body and the reflective layer.

FIGS. 6A to 6D are comparative views of light emitting device modules according to embodiments and a comparative embodiment. In FIGS. 6A to 6D, a light emitting device is briefly illustrated in a hexahedral shape and a circuit board below the light emitting device is omitted.

Figure 6A:
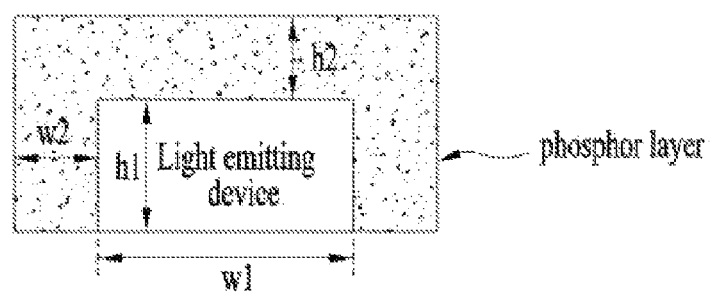
FIGS. 6A to 6D are comparative views of light emitting device modules according to embodiments and a comparative embodiment.

In the comparative embodiment of FIG. 6A, a phosphor layer is disposed on the side surface and the upper surface of a light emitting device. Either side of the light emitting device may have a width w1 of 1000 μm and a height h1 of 250 μm. In addition, a thickness w2 of the phosphor layer at one side surface of the light emitting device may be 100 μm and a thickness h2 of the phosphor layer at the upper surface of the light emitting device may be 100 μm.

Figure 6B:
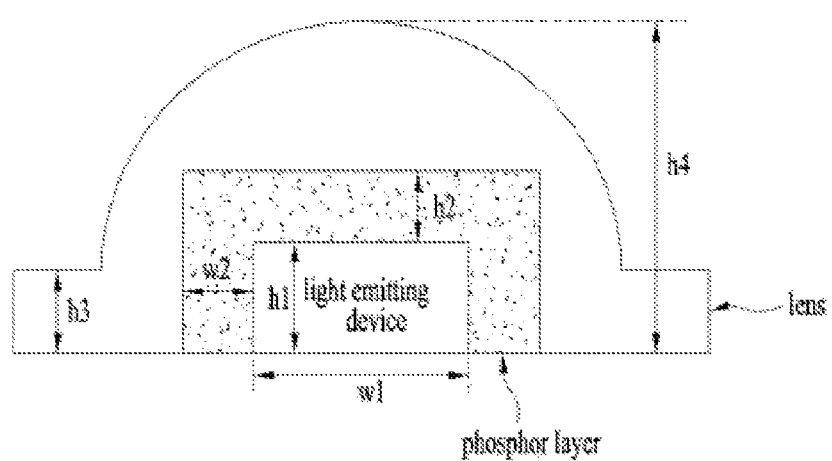

In the embodiment of FIG. 6B, a light emitting device and a phosphor layer have the same shape as those of the comparative embodiment of FIG. 6A and there is a difference in that a lens is disposed on the side surface and the upper surface of the phosphor layer. The lens may have a thickness h3 of 200 μm at the periphery thereof and may have a thickness h4 of 850 μm at the center thereof. Here, the lens has a central convex portion and the thickness h4 at the center of the lens may be a thickness of the convex portion.

Figure 6C:
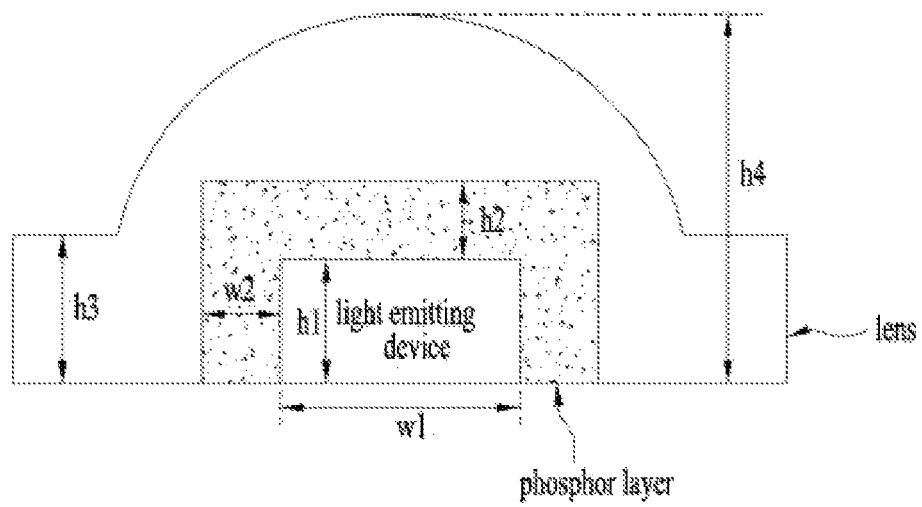

The embodiment of FIG. 6C is identical to that of FIG. 6B except that the lens has a thickness h3 of 300 μm at the periphery thereof.

Figure 6D:
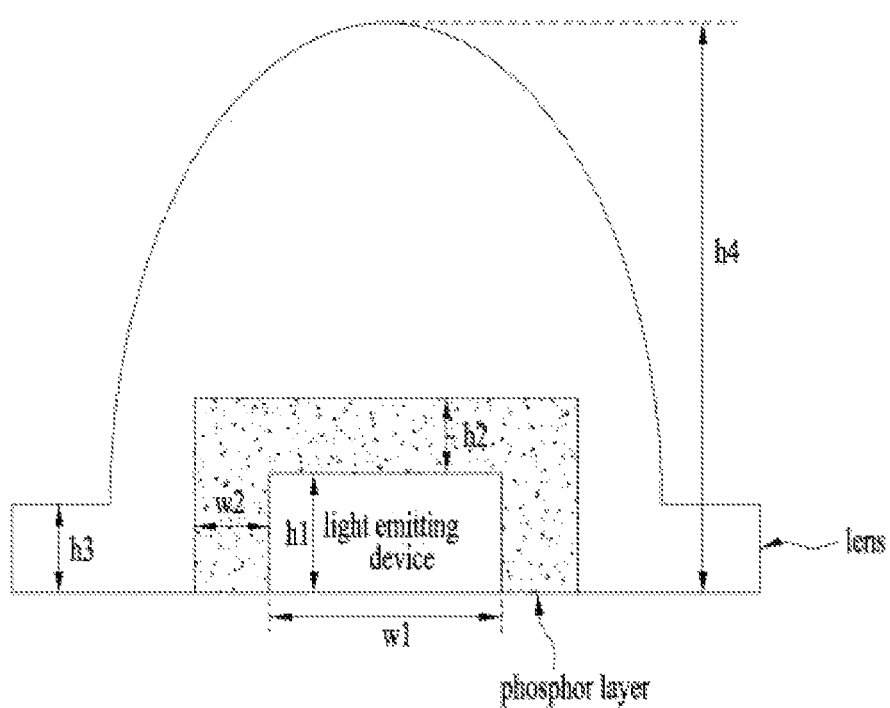

The embodiment of FIG. 6D is identical to that of FIG. 6B except that the lens has a thickness h4 of 1460 μm at the center thereof.

Assuming that the light output of the light emitting device module according to the comparative embodiment of FIG. 6A is 100, the light outputs of the light emitting device modules illustrated in FIGS. 6B to 6D are respectively 106.7, 107.2 and 104.0. In addition, the view angle of the light emitting device module according to the comparative embodiment of FIG. 6A is 137.3°, and the view angles of the light emitting device modules illustrated in FIGS. 6B to 6D are respectively 150.29°, 143.88°, and 139.64°.

In FIGS. 6A to 6D, when the thickness h3 of the lens at the periphery thereof is greater than the height h1 of the light emitting device and less than the total height h1+h2 of the light emitting device and the phosphor layer, the light output of the light emitting device module is improved. In addition, the light emitting device modules of FIGS. 6B and 6C, in which the thickness h4 of the lens at the center thereof is within a range from two times to three times the total height h1+h2 of the light emitting device and the phosphor layer, have higher light outputs and wider view angles than the light emitting device module of FIG. 6D in which the thickness h4 of the lens at the center thereof is four times or more the total height h1+h2 of the light emitting device and the phosphor layer.

FIGS. 7A to 7D are other comparative views of light emitting device modules according to embodiments and a comparative embodiment.

Differently from the light emitting device modules of FIGS. 6B to 6D, in the light emitting device modules of FIGS. 7A to 7D, a lens may have a flat central region other than a convex central region.

Figure 7A:
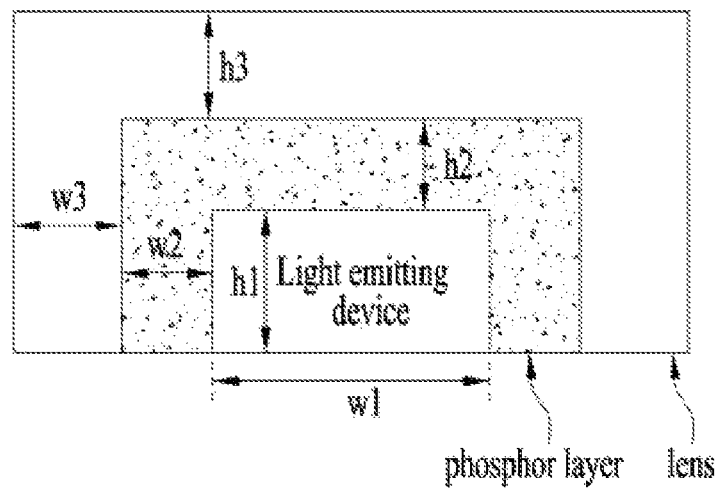
FIGS. 7A to 7D are other comparative views of light emitting device modules according to embodiments and a comparative embodiment.

The light emitting device module of FIG. 7A further includes a lens disposed on the side surface and the upper surface of the phosphor layer as compared to the light emitting device module of FIG. 6A. Either side of the light emitting device may have the width w1 of 1000 μm and the height h1 of 250 μm. The thickness w2 of the phosphor layer at one side surface of the light emitting device may be 100 μm and the thickness h2 of the phosphor layer at the upper surface of the light emitting device may be 100 μm. In addition, a thickness w3 of the side surface of the lens may be 100 μm and a thickness h3 of the upper surface of the lens may be 100 μm.

Figure 7B:
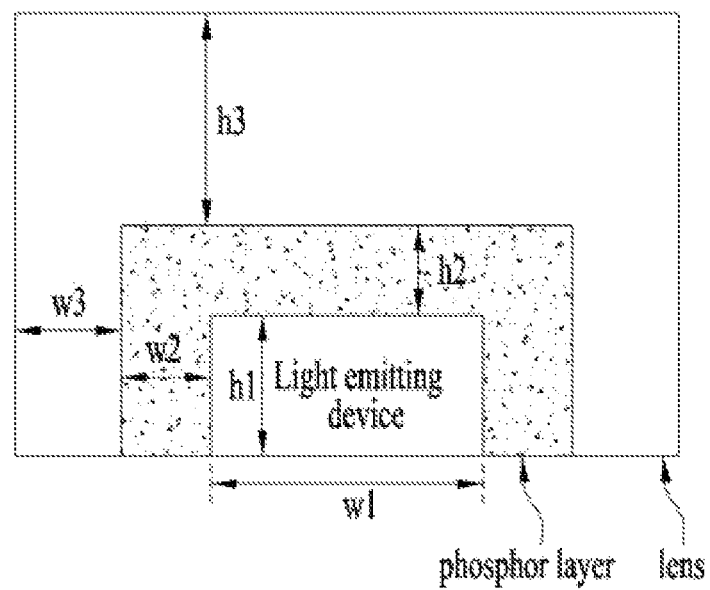

Although the light emitting device module of FIG. 7B is identical to that of the embodiment of FIG. 7A, the thickness h3 of the upper surface of the lens may be 200 μm.

Figure 7C:
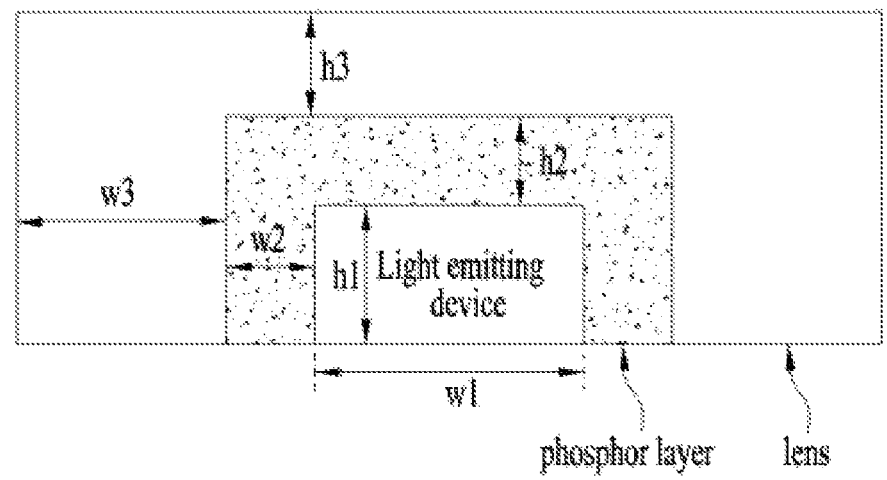

Although the light emitting device module of FIG. 7C is identical to that of the embodiment of FIG. 7A, the thickness w3 of the side surface of the lens may be 200 μm.

Figure 7D:
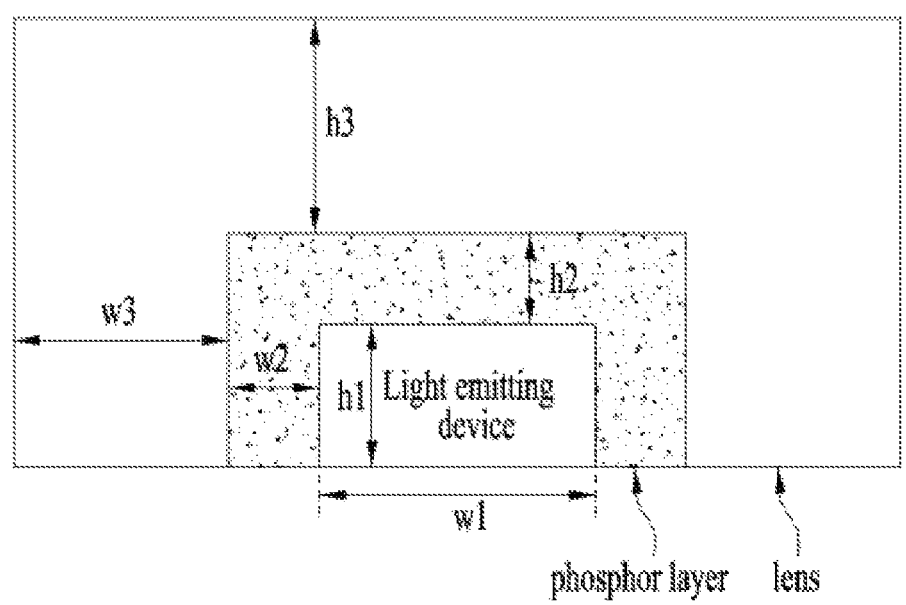

Although the light emitting device module of FIG. 7D is identical to that of the embodiment of FIG. 7A, the thickness w3 of the side surface of the lens and the thickness h3 of the upper surface of the lens may be 200 μm respectively.

Assuming that the light output of the light emitting device module according to the comparative embodiment of FIG. 6A is 100, the light outputs of the light emitting device modules illustrated in FIGS. 7A to 7D are respectively 102.3, 102.8, 102.2 and 102.7. In addition, the view angle of the light emitting device module according to the comparative embodiment of FIG. 6A is 137.3° and the view angles of the light emitting device modules illustrated in FIGS. 7A to 7D are respectively 143.15°, 145.78°, 142.21°, and 148.85°.

In FIGS. 7A to 7D, when the lens is disposed on the upper surface and the side surface of the phosphor layer, the light output is improved and the view angle is increased. In particular, as in the light emitting device module of FIG. 7B, when the thickness w3 of the side surface of the lens is equal to the thickness w2 of the side surface of the phosphor layer and the thickness h3 of the upper surface of the lens is about two times the thickness h2 of the upper surface of the phosphor layer, the light emitting device module may has the greatest light output. In addition, as in the light emitting device module of FIG. 7D, when the thickness w3 of the side surface of the lens and the thickness h3 of the upper surface of the lens are respectively about two times the thickness w2 of the side surface of the phosphor layer and the thickness h2 of the upper surface of the phosphor layer, the light emitting device module may have the greatest view angle.

The light emitting device module as described above may be used as a light source. For example, the light emitting device module may be used as a light source of, for example, an image display apparatus and a lighting apparatus.

Figure 8A:
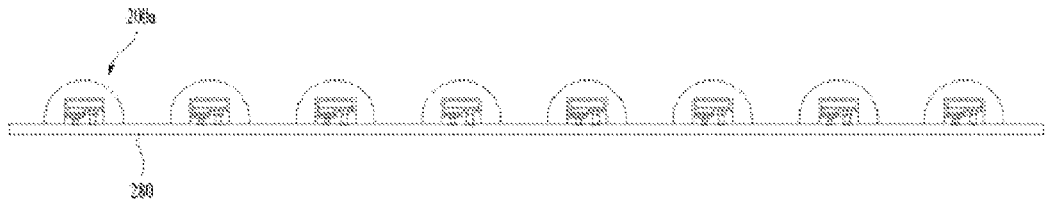
FIGS. 8A to 8C are views illustrating an array of the above-described light emitting device modules.
Figure 8B:
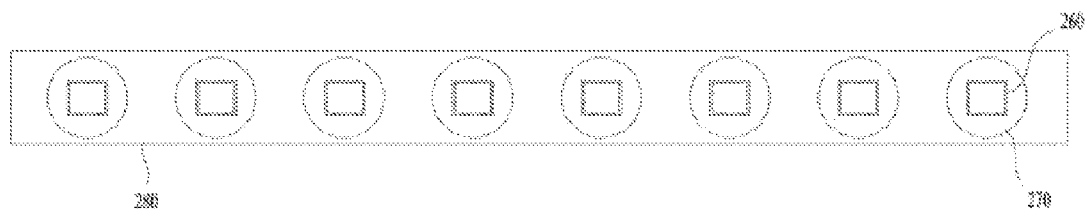
Figure 8C:
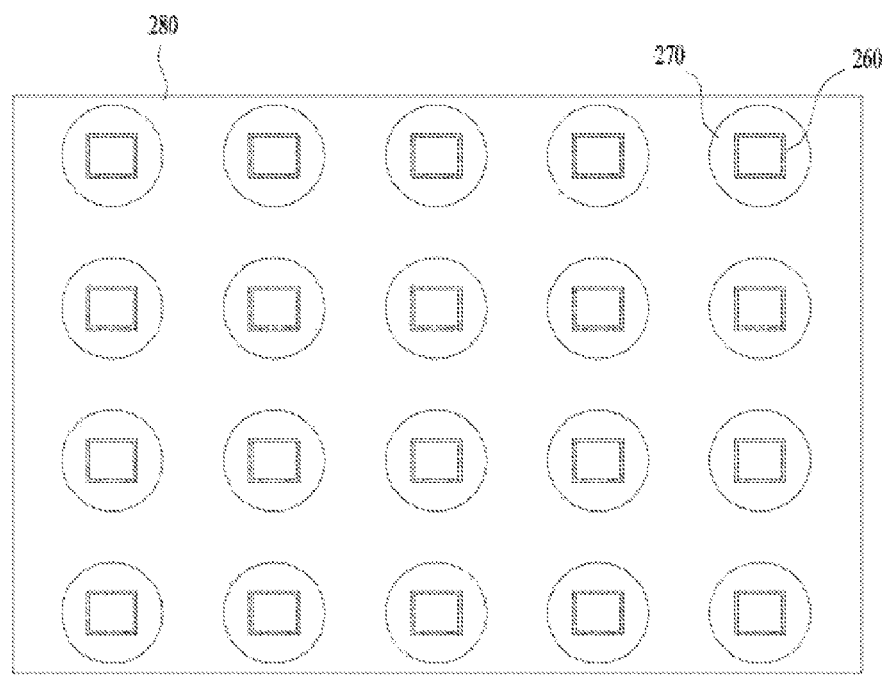

FIGS. 8A to 8C are views illustrating an array of the light emitting device modules as described above.

As exemplarily illustrated in FIGS. 8A and 8B, the light emitting device modules 200a as described above may be arranged in a single line on a single circuit board 280 so as to be used in a lighting apparatus or to be used as an edge type light source in an image display apparatus.

As exemplarily illustrated in FIG. 8C, a plurality of light emitting device modules may be arranged in plural rows and columns on a single circuit board 280. In particular, the light emitting device modules may be used as a vertical type light source in an image display apparatus.

When the light emitting device modules are used as a light source of an image display apparatus or a lighting apparatus, reduced material costs and enhanced luminous efficacy may be accomplished and the entire light source may achieve uniform color temperature.

As is apparent from the above description, a light emitting device module according to the embodiments may achieve reduced material costs and enhanced luminous efficacy owing to reduction in light absorption or shielding caused by wires because wires and lead frames are omitted and a flip chip type light emitting device is directly coupled to a circuit board. In addition, through omission of a package body and a reflective layer on the package body, the light emitting device module may prevent distortion of color temperatures due to discoloration of the package body and the reflective layer. Embodiments provide a light emitting device module which is capable of achieving reduced manufacturing costs and improved light extraction efficiency and preventing discoloration of, for example, a package body.

In one embodiment, a light emitting device module includes a circuit board, a light emitting device bonded to a conductive layer on the circuit board via a conductive adhesive, a phosphor layer disposed on a side surface and an upper surface of the light emitting device, and a lens on the circuit board and the phosphor layer, wherein a void is generated between the light emitting device and the circuit board.

The light emitting device may include a light emitting structure on a substrate, and the void may be generated between the light emitting structure and the circuit board.

The phosphor layer may be disposed to extend from the side surface of the light emitting device to a surface of the circuit board, and the void may be generated in a region surrounded by the phosphor layer and the circuit board.

The void may be filled with air.

The light emitting device may be a flip chip type light emitting device.

The phosphor layer disposed on the side surface of the light emitting device may be located higher than a height of the light emitting structure.

The light emitting device may have a first side surface and a second side surface facing each other, and a distance between the phosphor layer and the circuit board at the first side surface may be equal to a distance between the phosphor layer and the circuit board at the second side surface.

The phosphor layer and the lens may comprise silicon.

The lens may come into contact with the phosphor layer and the circuit board.

The lens may have a recess and the light emitting device may be inserted into the recess.

The recess may have a depth equal to a height of the phosphor layer.

A height of the phosphor layer at the side surface of the light emitting device may be equal to a height of the light emitting device.

A thickness of the phosphor layer at the side surface of the light emitting device may be equal to a thickness of the phosphor layer at the upper surface of the light emitting device.

The light emitting device may have a first side surface and a second side surface facing each other, and a thickness of the phosphor layer at the first side surface may be equal to a thickness of the phosphor layer at the second side surface.

A thickness of the lens at the periphery thereof outside the light emitting device may be greater than a height of the light emitting device and less than the sum of the height of the light emitting device and a height of the phosphor layer.

A thickness of the lens at the center thereof may be within a range from two times to three times the sum of a height of the light emitting device and a height of the phosphor layer.

In another embodiment, a light emitting device module includes a circuit board, a light emitting device configured to electrically come into contact with a conductive layer on the circuit board, a phosphor layer disposed on a side surface and an upper surface of the light emitting device, and a lens disposed on the circuit board and the phosphor layer, wherein the phosphor layer is spaced apart from the circuit board at the side surface of the light emitting device.

The light emitting device may include a light emitting structure and a height of a surface of the light emitting structure and a height of the phosphor layer may be equal to each other at the side surface of the light emitting device.

The light emitting device may have a first side surface and a second side surface facing each other, and a distance between the phosphor layer and the circuit board at the first side surface may be equal to a distance between the phosphor layer and the circuit board at the second side surface.

In a further embodiment, a light emitting device module includes a circuit board, a light emitting device bonded to a conductive layer on the circuit board via a conductive adhesive, a phosphor layer disposed on a side surface and an upper surface of the light emitting device, and a lens disposed on the circuit board and the phosphor layer, wherein a thickness of the lens at the periphery thereof outside the light emitting device is greater than a height of the light emitting device and less than the sum of the height of the light emitting device and a height of the phosphor layer, and wherein a thickness of the lens at the center thereof is within a range from two times to three times the sum of the height of the light emitting device and the height of the phosphor layer.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device module comprising:
   a first circuit board;
   a light emitting device provided on the first circuit board;
   a phosphor layer provided on a side surface and an upper surface of the light emitting device; and
   a lens provided on the phosphor layer,
   wherein a void is disposed between the light emitting device and the first circuit board, wherein the phosphor layer is separated from the first circuit board, and wherein a distance between a lower surface of the phosphor layer and the first circuit board at a first side surface of the light emitting device is smaller than a distance between a lower surface of the phosphor layer and the first circuit board at a second side surface of the light emitting device.

2. The module according to claim 1, wherein the light emitting device includes a light emitting structure on a substrate, and the void is disposed below the light emitting structure.

3. The module according to claim 2, wherein a portion of the void is disposed in a region surrounded by the phosphor layer.

4. The module according to claim 1, wherein the void is filled with air.

5. The module according to claim 1, wherein the light emitting device is a flip chip type light emitting device.

6. The module according to claim 2, wherein a bottom surface of the phosphor layer provided on the first and second side surfaces of the light emitting device is located lower than a bottom surface of the light emitting structure.

7. The module according to claim 1, wherein the first side surface and the second side surface face each other.

8. The module according to claim 1, wherein the phosphor layer and the lens include silicon.

9. The module according to claim 1, wherein the lens comes into contact with the phosphor layer.

10. The module according to claim 1, wherein the lens has a recess and the light emitting device is inserted into the recess.

11. The module according to claim 10, wherein the recess has a depth equal to a height of the phosphor layer.

12. The module according to claim 1, wherein a thickness of the phosphor layer at the first side surface is equal to a thickness of the phosphor layer at the second side surface.

13. The module according to claim 1, wherein a thickness of the lens at the center thereof is within a range from two times to three times the sum of a height of the light emitting device and a height of the phosphor layer.

14. The module according to claim 2, wherein the light emitting structure includes a first conductive semiconductor layer, an active layer, and a second conductive semiconductor layer.

15. The module according to claim 1, further including a first conductive layer and a second conductive layer on the circuit board.

16. The module according to claim 15, wherein the light emitting device includes a first electrode and a second electrode, and the first electrode and the second electrode are electrically connected to the first conductive layer and the second conductive layer via conductive adhesive, respectively.

* * * * *